(12) United States Patent
Makinouchi

(10) Patent No.: US 6,646,715 B1
(45) Date of Patent: Nov. 11, 2003

(54) SCANNING EXPOSURE APPARATUS AND METHOD WITH RUN-UP DISTANCE CONTROL

(75) Inventor: Susumu Makinouchi, Zama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/496,627

(22) Filed: Feb. 2, 2000

Related U.S. Application Data

(63) Continuation of application No. 09/006,197, filed on Jan. 13, 1998, now abandoned.

(30) Foreign Application Priority Data

| Jan. 14, 1997 | (JP) | 9-004495 |
| Mar. 17, 1997 | (JP) | 9-083244 |

(51) Int. Cl.$^7$ .................. G03B 27/42; G03B 27/32; G01B 11/00
(52) U.S. Cl. .................. 355/53; 355/77; 356/399
(58) Field of Search .................. 355/53, 50, 51, 355/55; 33/568; 430/311; 356/399, 400, 401

(56) References Cited

U.S. PATENT DOCUMENTS

| 5,266,445 A | 11/1993 | Seligson | 430/311 |
| 5,477,304 A | 12/1995 | Nishi | 355/53 |
| 5,502,899 A | 4/1996 | Yamaguchi et al. | 33/568 |
| 5,995,203 A | * 11/1999 | Ueda | 355/67 |
| 6,172,739 B1 | * 1/2001 | Murata | 355/53 |
| 6,195,155 B1 | * 2/2001 | Kawai | 355/53 |

FOREIGN PATENT DOCUMENTS

| JP | 08-008159 | 1/1996 |
| JP | 09-134864 | 5/1997 |

* cited by examiner

*Primary Examiner*—Russell Adams
*Assistant Examiner*—Peter B. Kim
(74) *Attorney, Agent, or Firm*—Morgan, Lewis & Bockius LLP

(57) ABSTRACT

A method is provided for transferring a mask pattern on a mask onto each of a plurality of shot areas on a substrate by synchronously moving the mask and the substrate with respect to an exposing radiation flux. The method includes the steps of optimizing run-up distances of the mask and the substrate with respect to each of the plurality of shot areas, determining respective acceleration starting positions for the mask and the substrate for the shot area to be exposed in accordance with the corresponding run-up distances optimized in the step of optimizing, and accelerating the mask and the substrate from the respective acceleration starting positions to respective scanning speeds. The method further includes the steps of maintaining the respective scanning speeds of the mask and the substrate to synchronously move the mask and the photosensitive substrate, and directing the exposing radiation flux towards the mask to project the image of the mask pattern onto the shot area when the mask and the substrate complete respective run-up distances in the step of maintaining.

14 Claims, 7 Drawing Sheets

SCANNING EXPOSURE APPARATUS AND METHOD WITH RUN-UP DISTANCE CONTROL

This is a continuation of application Ser. No. 09/006,197 filed on Jan. 13, 1998 now abandoned.

This application claims the benefit of Japanese Applications No. 09-004495, filed in Japan on Jan. 14, 1997, and No. 09-083244, filed in Japan on Mar. 17, 1997, both of which are hereby incorporated by reference.

BACKGROUND OF THE INVENTION

1. Field of the Invention

The present invention relates to an exposure method and apparatus, and more particularly, to a scanning exposure method and apparatus for use in photolithography processes in the manufacture of semiconductor devices, image pickup devices (such as CCD), liquid crystal display devices, thin-film magnetic heads, and the like.

2. Discussion of the Related Art

In a photolithography process in the manufacture of semiconductor devices, an exposure apparatus has been used for projecting a circuit pattern on a mask (also referred to as "reticle") onto a substrate (also referred to as "wafer" or "photosensitive substrate"). In order to transfer a large circuit pattern with high accuracy and without increasing a burden on a projection optical system of the exposure apparatus, a so-called step-and-scan type exposure apparatus (or scanning exposure apparatus) has been recently developed. In the scanning exposure apparatus, the reticle and wafer are scanned in synchronization with each other with respect to an exposing radiation flux. A portion of the reticle pattern is thus illuminated so that the entire reticle pattern is successively projected onto each short area of the wafer through the projection optical system in a scanning manner. During the exposure operation of the scanning exposure apparatus, the reticle stage and the wafer stage need to be synchronously moved relative to each other at respective constant speeds.

In a conventional scanning exposure apparatus, after reticle alignment and wafer alignment are performed the reticle stage and wafer stage are moved to respective run-up start positions. Then, the reticle and wafer stages are accelerated in the respective scanning directions up to respective target speeds. After maintaining the target speeds for a predetermined settling time, which is required to settle synchronization errors between the reticle stage (reticle) and the wafer stage (wafer) within a predetermined tolerance, the reticle and wafer stages are irradiated with exposure light at the edge of the reticle pattern and the edge of the shot area on the wafer.

As described above, the reticle and wafer stages need to travel over certain run-up distances from the respective run-up start positions before starting actual exposure. In the conventional the step-and-scan exposure apparatus, the run-up distances are determined by adding a certain margin to the sum of an acceleration distance required for acceleration of each stage and a distance over which each stage travels during the worst (longest) settling time required and accordingly is fixed to a constant value. The run-up start positions of the stages are then determined such that the stages reach their respective exposure start positions after traveling the thus determined run-up distance. Accordingly, scanning exposure is started after ensuring the synchronization errors between the reticle and wafer are held within the fixed tolerance for each shot area.

However, in most cases, the actual time (settling time) necessary for the synchronization errors to settle within the fixed tolerance after the wafer and reticle stages reach their target speeds is not constant, but depends on various conditions, such as the position of a shot area (position of wafer stage), scanning speeds, and scanning directions of the reticle stage and wafer stage, etc. When the run-up distance is determined based on the worst value of the settling time and the run-up start position of each stage is uniformly determined based on the run-up distance, the run-up distance is unnecessarily greater than the actually required run-up distance for many shot areas. This results in a low throughput (low productivity).

In the step-and-scan type scanning exposure apparatus, in particular, since scanning exposure is carried out for each of many shot areas on the wafer, the exposure time tends to be longer than that of stationary-type exposure apparatus, such as a step-and-repeat exposure apparatus (so-called stepper). Accordingly, there is a need to further improve the throughput of the scanning exposure apparatus.

SUMMARY OF THE INVENTION

Accordingly, the present invention is directed to a scanning exposure method and apparatus that substantially obviates the problems due to limitations and disadvantages of the related art.

An object of the present invention is to provide a scanning exposure method that makes it possible to reduce run-up distances of stages for scanning exposure without increasing synchronization errors, thereby improving the throughput.

Another object of the present invention is to provide a scanning exposure apparatus that can carry out such a scanning exposure method.

A further object of the present invention is to provide a scanning exposure apparatus in which the run-up distance for each shot area is optimized to thereby improve the throughput while assuring high exposure accuracy.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a scanning exposure method according to a first aspect of the present invention includes the steps of accelerating a mask and a photosensitive substrate up to respective predetermined scanning speeds, starting projecting a part of a pattern formed on the mask onto the photosensitive substrate while a synchronization error between the mask and the photosensitive substrate is held in a predetermined tolerance, and moving the mask and the photosensitive substrate relative to each other so that the pattern of the mask is sequentially transferred to each shot area on the photosensitive substrate. In this scanning exposure method, when an exposure operation is performed with respect to a first shot area of a first photosensitive substrate, an acceleration settling time that is required for the synchronization error to settle within the tolerance is measured from a point of time when the mask and the photosensitive substrate start being accelerated, and stored, and when an exposure operation is performed with respect to a second shot area of a second photosensitive substrate, acceleration starting positions of the mask and the second photosensitive substrate are determined based on the acceleration settling time measured with respect to the first shot area.

According to the present invention, where the acceleration settling time measured for the first shot area is relatively short, the acceleration starting positions of the mask and the second photosensitive substrate are set to be relatively close to their exposure start positions. Namely, the run-up distances for the mask and photosensitive substrate may be shortened by learning the acceleration settling time from actual measurements, while ensuring that the synchronization error settles within the tolerance at the exposure start positions. This leads to reduction in the exposure time and improves the throughput. In this case, where the first photosensitive substrate is identical to the second photosensitive substrate, the acceleration settling time measured for the shot area(s) of one photosensitive substrate that has/have been exposed to light may be used for determining the acceleration starting positions (run-up distances) for the next shot area of the same substrate that is to be exposed to light.

When the first photosensitive substrate is different from the second photosensitive substrate, on the other hand, the acceleration starting positions (run-up distances) for each shot area of the second photosensitive substrate in a certain lot may be determined based on the acceleration settling time measured for all of the shot areas of the first photosensitive substrate in the same lot. In another method, the acceleration starting positions (run-up distances) for a shot area located at a certain position of the second photosensitive substrate may be determined based on the acceleration settling time measured for a shot area located at the same position of the first photosensitive substrate.

In the above case, the acceleration starting positions of the mask and the second photosensitive substrate may be determined based on the acceleration settling time, such that each of the acceleration starting positions is located ahead of a corresponding exposure start position with a spacing that is obtained by adding a spacing that provides a given margin to a distance over which each of the mask and the photosensitive substrate travels within the acceleration settling time. The distance that provides the given margin corresponds to a maximum of measured values of variations in the acceleration settling time at the same scanning speed as the first photosensitive substrate, for example. Thus, the synchronization error can surely be settled within the tolerance by the time the second shot area of the second photosensitive substrate reaches the exposure start position.

The first photosensitive substrate and the second photosensitive substrate may be the same photosensitive substrate. In this case, the run-up distance for the shot area that is to be exposed next can be shortened, as compared with that for the shot area of the same photosensitive substrate that has been exposed to light.

According to a second aspect of the present invention, the present invention also provides a scanning exposure apparatus including a mask stage for moving a mask and a substrate stage for moving a photosensitive substrate, wherein the mask and the photosensitive substrate are accelerated up to respective predetermined scanning speeds, a part of a pattern formed on the mask is projected onto the photosensitive substrate while a synchronization error between the mask and the photosensitive substrate is held in a predetermined tolerance, and the mask and the photosensitive substrate are synchronously moved relative to each other so that the pattern of the mask is sequentially transferred to each shot area on the photosensitive substrate. This exposure apparatus includes control means for measuring, when an exposure operation is performed with respect to a first shot area of a first photosensitive substrate, an acceleration settling time that is required for the synchronization error to settle within the tolerance from a point of time when the mask and the photosensitive substrate start being accelerated, and storing the acceleration settling time, and computing means for determining, when an exposure operation is performed with respect to a second shot area of a second photosensitive substrate, acceleration starting positions of the mask and the second photosensitive substrate, based on the acceleration settling time measured with respect to the first shot area. The scanning exposure method of the present invention is carried out by the scanning exposure apparatus constructed as described above.

In a third aspect, the present invention provides a scanning exposure apparatus including a mask stage that holds a mask and is movable in a scanning direction, a substrate stage that holds a substrate to be exposed to light such that a pattern on the mask is projected onto the substrate, the substrate stage being movable in the scanning direction and a non-scanning direction perpendicular to the scanning direction, and a stage control unit that accelerates the mask stage and the substrate stage from run-up start positions up to respective predetermined scanning speeds, settles a synchronization error between the mask stage and the substrate stage within a predetermined tolerance, and then controls constant-speed movements of the mask stage and the substrate stage that are kept in synchronization with each other. The scanning exposure apparatus further includes storage means for storing in advance a settling time required for settling the synchronization error to within the tolerance or coefficients that numerically represent influences on the settling time, for each of parameters that influence the settling time, wherein the stage control unit reads out the settling time or coefficients from the storage means depending upon exposure conditions, prior to exposure of each shot area on the substrate to be exposed, and change the run-up start positions according to the settling time or coefficients.

In the arrangement as described above, the storage means stores in advance the settling time required for the synchronization error between the mask stage and substrate stage to be settled to within the tolerance, or coefficients that numerically represent influences on the settling time, for each of parameters that influence the settling time or settling distance. In the actual exposure operation, the stage control unit reads out the settling time or the coefficients that numerically represent the influences on the settling time from the storage means depending upon exposure conditions, prior to exposure of each shot area on the substrate to be exposed, and changes the run-up start position of each stage according to the information thus read. Since the run-up start positions of both the mask and wafer stages are determined based on the settling time corresponding to the exposure conditions for each shot area, the run-up distance for each shot area can always be controlled to an optimum value. This leads to an improved throughput, as compared with the known example in which the run-up distance (or run-up period) is uniformly determined based on the worst or longest settling time. Also, the exposure accuracy does not deteriorate since the synchronization error has been held within the tolerance when the exposure is started.

A typical parameter in the above case that influences the setting time is the position of the stage, namely, the position of the shot area on the substrate to be exposed. In addition to the position of the shot area, parameters desirably include the scanning speeds of the mask stage and substrate stage and the scanning directions of the mask stage and substrate stage relative to the projection optical system.

Generally, the scanning speed needs to be changed depending upon an exposure amount that has been set, while the settling time varies depending upon the scanning speed. According to the present invention, the storage means stores in advance the settling times or coefficients that numerically represent influences on the settling time for different scanning speeds. Thus, even when exposure conditions, such as the exposure amount set, is changed and the scanning speed is accordingly changed, the stage control system reads out from the storage means the settling time or coefficients that numerically represent influences on the settling time depending upon the scanning speed thus changed. The stage control system changes the run-up start position according to the settling time or coefficients. Thus, the run-up distance is set to an optimum value.

The mask stage and substrate stage are often driven with different characteristics depending upon the scanning directions thereof, and the settling time varies depending upon the scanning directions. According to the present invention, the storage means stores in advance the settling time or coefficients that numerically represent influences on the settling time for different scanning directions. Accordingly, the stage control system reads from the storage means the settling time or coefficients that numerically represent influences on the settling time depending upon the scanning direction during exposure of each exposure area, and changes the run-up start position according to the information thus read, so as to establish an optimum run-up distance.

In a fourth aspect, the present invention provides a scanning exposure apparatus including a mask stage that holds a mask and is movable in a scanning direction, a substrate stage that holds a substrate to be exposed to light such that a pattern on the mask is projected onto the substrate, the substrate stage being movable in the scanning direction and a non-scanning direction perpendicular to the scanning direction, and a stage control unit that accelerates the mask stage and the substrate stage from run-up start positions to respective predetermined scanning speeds, settles a synchronization error between the mask stage and the substrate stage to within a predetermined tolerance, and then controls constant-speed movements of the mask stage and substrate stage so that they are synchronized. The scanning exposure apparatus further includes a host device that gives an exposure command to the stage control unit, prior to exposure of each shot area on the substrate to be exposed, the host device having information on a settling time that is measured for each shot area under predetermined exposure conditions to represent a period of time required for settling the synchronization error within the tolerance, the exposure command given to the stage control unit including the information on the settling time for each shot area.

In the scanning exposure apparatus as described above, the host device has information indicating the settling time required for the synchronization error to be settled to within the tolerance measured for each shot area under predetermined exposure conditions. Before exposure of each shot area in the actual exposure operation, the hose device generates an exposure command including the settling time for the relevant shot area to the stage control unit, and the stage control unit changes the run-up start positions of both stages based on the information indicating the settling time included in the exposure command. Thus, the run-up start positions of both of the stages are determined based on the information indicating the settling time included in the exposure command for each shot area, and therefore the run-up distance for each shot area can be always controlled to an optimum value. This leads to an improved throughput, compared to the conventional apparatus in which the run-up distance (or run-up period) is always uniformly determined based on the worst or longest settling time. Further, the exposure accuracy does not deteriorate since the synchronization error has been held within the tolerance by the time exposure is started.

The scanning exposure apparatus according to this aspect of the present invention is particularly suitable when exposure conditions for all of the shot areas are predetermined, and exposure operations are repeatedly performed for a given period of time without changing the exposure conditions of all of the shot areas.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

First Preferred Embodiment

Figure 1:
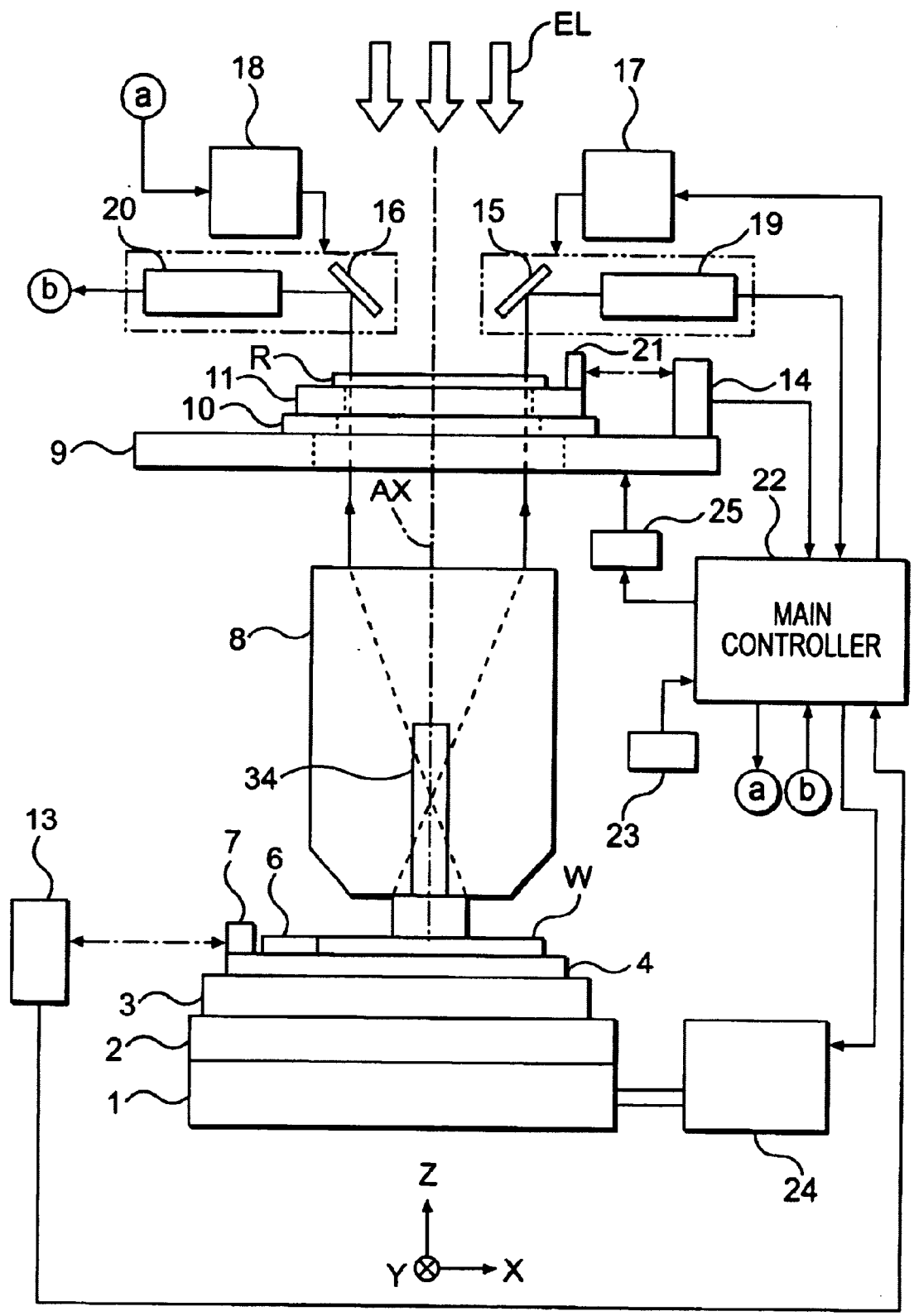
FIG. 1 schematically shows the overall construction of a scanning exposure apparatus according to a first preferred embodiment of the present invention.

A first preferred embodiment of the present embodiment will be described with reference to the drawings. In this embodiment, the present invention is applied to a step-and-scan type projection exposure apparatus. FIG. 1 shows a projection exposure apparatus 100 according to the present embodiment. A reticle pattern formed on a reticle R is illuminated by a rectangular illumination area of exposure light (EL) emitted from an illumination optical system (not shown in the figure), and the image of the reticle pattern is reduced through a projection optical system 8 and projected onto a wafer W (or a photosensitive substrate) that is coated with a photoresist.

The exposure light EL may be selected from continuous emission light, such as the i-line (wavelength: 365 nm) of a mercury lamp, pulse light beam, such as excimer laser beams including a KrF excimer laser beam (wavelength: 248 nm) and an ArF excimer laser beam (wavelength: 193 nm), and higher harmonics of a metal vapor laser beam and YAG laser beam. In the present embodiment, the excimer laser is used as the exposure light EL as an example.

In the following description, the Z axis is taken parallel to the optical axis AX of the projection optical system 8, the X axis is taken perpendicular to the Z axis and parallel to the plane of the sheet of FIG. 1, and the Y axis is taken perpendicular to the plane of the sheet of FIG. 1.

In the projection optical system 8, a dioptric, both-side telecentric system is used with a predetermined reduction magnification $\beta$ ($\beta$ is equal to ¼, ⅕, for example). The optical axis AX of the projection optical system 8 extends in the Z direction. During scanning exposure operation, the wafer W is moved relative to the illumination area of the exposure light EL at a constant speed V in the positive Y direction (or negative Y direction) perpendicular to the plane of the sheet of FIG. 1, and the reticle R is moved relative to the illumination area at a constant speed $V/\beta$ in the negative Y direction (or positive Y direction) in synchronization with the wafer W movement.

A reticle R is held on a reticle micro driving stage 11 by vacuum suction or the like. The reticle micro driving stage 11 is mounted on a reticle Y-axis driving stage 10, and the reticle Y-axis driving stage 10 is in turn mounted on a reticle support 9 to be movable in the positive and negative Y directions. The displacements of the reticle micro driving stage 11 relative to the reticle Y-axis driving stage 10 in the X direction, Y direction, and the rotational direction ($\theta$ direction) are finely adjustable to control the position of the reticle R with high accuracy.

Mirror 21 is disposed on the reticle micro driving stage 11, and the positions of the reticle micro driving stage 11 in the X direction, Y direction, and $\theta$ direction are constantly monitored by a reticle laser interferometer 14 (referred to as "reticle interferometer") that is coupled to the mirror 21 and placed on the reticle support 9. Here, the mirror 21 represents one X-axis mirror and two Y-axis mirrors, and the reticle interferometer 14 represents three corresponding interferometers (or a three-axis interferometer. See FIG. 2B).

The positional information obtained by the reticle interferometer 14 is supplied to a main control system 22 that controls overall operations of the apparatus. In particular, the main control system 22 controls the reticle Y-axis driving stage 10 and reticle micro driving stage 11 through a reticle drive device 25. The reticle support 9, reticle Y-driving stage 10, and reticle micro driving stage 11 constitute a reticle stage (or reticle stage system). An input device 23 is connected to the main control system 22 for an operator to enter various commands.

The wafer W is held on the $Z\theta$-axis driving stage 4 by vacuum suction. The $Z\theta$-axis driving stage 4 controls the Z-directional position and the rotational angle of the wafer thereon. The $Z\theta$-axis driving stage 4 is mounted on a wafer X-axis driving stage 3. The wafer X-axis driving stage 3 is in turn mounted on a wafer Y-axis driving stage 2 and is movable in the positive and negative X-directions relative to the wafer Y-axis driving stage 2. The wafer Y-axis driving stage 2 is mounted on a wafer support 1 and is movable in the positive and negative Y directions relative to the wafer support 1.

Mirror 7 is fixed on the $Z\theta$-axis driving stage 4, and the position of the $Z\theta$-axis driving stage 4 (wafer W) in the X direction, Y direction, and $\theta$ direction is monitored by a laser interferometer 13 (referred to as "wafer interferometer") that is installed separately. The positional information obtained by the wafer interferometer 13 is supplied to the main control system 22. Here, the mirror 7 represents two mirrors extending in the mutually orthogonal directions, and the wafer interferometer 13 represents four-axis laser interferometers (see FIG. 2A). The main control system 22 controls the wafer Y-axis driving stage 2, wafer X-axis driving stage 3, and $Z\theta$-axis driving stage 4 via a wafer drive device 24. The wafer support 1, wafer Y-axis driving stage 2, wafer X-axis driving stage, and $Z\theta$-axis driving stage 4 constitute a wafer stage (or wafer stage system).

A fiducial mark plate 6 is installed on the $Z\theta$-axis driving stage 4 in the vicinity of the wafer W. The surface of the fiducial mark plate 6 is flush with the surface of the wafer W, and fiducial marks for use in alignment, as will be described later, are formed on the fiducial mark plate 6.

A pair of reticle alignment systems 19, 20 are located above the reticle R. Each of the reticle alignment systems 19, 20 includes an illumination system for illuminating reticle alignment marks with illumination light having the same wavelength as the exposure light EL and an alignment microscope for capturing the images of the alignment marks thus illuminated. The alignment microscope includes an imaging optical system and an image pickup device. In this embodiment, deflecting mirrors 15, 16 are movably disposed for guiding light from the reticle R to the respective reticle alignment systems 19, 20. Before an actual exposure sequence starts, the deflecting mirrors 15, 16 are moved by respective mirror drive devices 17, 18 in response to commands from the main control system 22, and are retracted from the optical path of the exposure light EL.

An image processing type, off-axis alignment sensor 34 is disposed on the Y-direction side of the projection optical system 8 to detect wafer alignment marks (wafer marks) formed on each shot area on the wafer W.

Figure 2A:
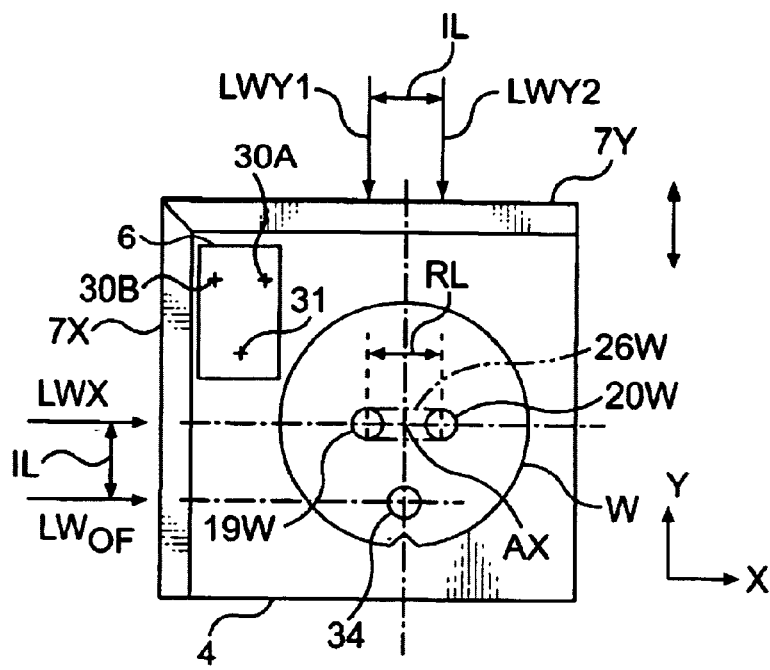
FIG. 2A is a plan view of a wafer stage of FIG. 1.
Figure 2B:
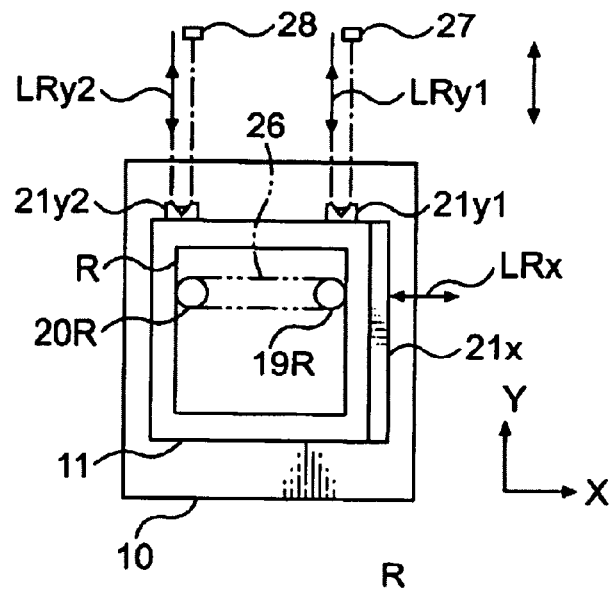
FIG. 2B a plan view of a reticle stage of FIG. 1.
Figure 2C:
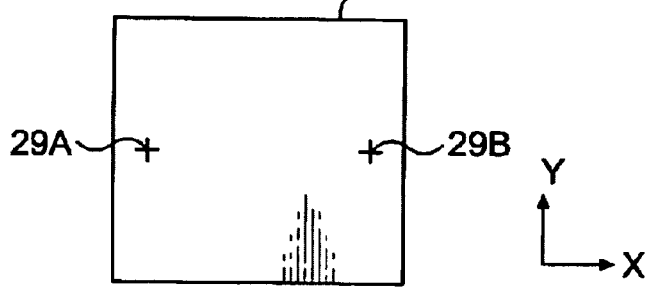
FIG. 2C is a plan view of alignment marks formed on a reticle of FIG. 1.

Referring to FIGS. 2A to 2C, the reticle and wafer stage systems are described in more detail. FIG. 2A is a plan view showing the wafer stage system. In FIG. 2A, the fiducial mark plate 6 is fixed on the $Z\theta$-axis driving stage 4 in the vicinity of the wafer W. A pair of fiducial marks 30A, 30B for use in reticle alignment and a fiducial mark 31 for use by the alignment sensor 34 are formed on the fiducial mark plate 6. Also, an X-axis mirror 7X extending in the Y direction is fixed on the negative X-direction end of the $Z\theta$-axis driving stage 4, and an Y-axis mirror 7Y extending in the X direction is fixed on the positive Y-direction end of the driving stage 4.

In FIG. 2A, the image of the reticle pattern created by exposure light is projected onto a rectangular exposure area 26W on the wafer W, and detection areas 19W, 20W, at which the reticle alignment systems 19, 20 of FIG. 1 can detect the positions of alignment marks, are arranged at respective ends of the exposure area 26W with a spacing RL therebetween.

The mirror 7X is irradiated with two parallel laser beams LWX, $LW_{OF}$ that are incident in the X-direction with a spacing IL. The extension of the path of the laser beam LWX goes through a point at which the optical axis AX of the projection optical system 8 intersects with the wafer W, and the extension of the path of the laser beam $LW_{OF}$ goes through the center of the detection area (reference point) of the alignment sensor 34. The mirror 7Y is irradiated with two parallel laser beams LWY1 and LWY2 that are incident in the negative Y-direction with a spacing IL. These laser beams LWX, $LW_{OF}$, LWY1, LWY2 are emitted by respective interferometers that are represented by the wafer interferometer 13 of FIG. 1. The coordinate XW, measured by the interferometer using the laser beam LWX, is used as the X coordinate of the Zθ-axis driving stage 4, and an average value YW (referred to as "Y coordinate of the wafer stage") derived by taking an average of coordinate values $Y_1$ and $Y_2$ measured by the interferometers using the laser beams LWY1, LWY2, respectively, is used as the Y coordinate of the Zθ-axis driving stage 4. Further, the rotational angle (displacement in the θ direction) of the Zθ-axis driving stage 4 is determined from a difference between the measured coordinate values $Y_1$, $Y_2$, for example. The position of the Zθ-axis driving stage 4 (wafer W) in the XY plane and its angle of rotation are controlled by monitoring these coordinates.

Here, since the coordinate YW in the Y direction (scanning direction) is an averaged value of measurement results obtained by two interferometers, errors caused by fluctuation in the air or the like, which may occur during scanning exposure, can be reduced due to the averaging effect. When the off-axis type alignment sensor 34 is used, the position of the Zθ-axis driving stage 4 in the X direction is controlled using the measurement values of the interferometer that uses the laser beam $LW_{OF}$. Therefore, the thus obtained X-axis position does not involve a so-called Abbe error.

FIG. 2B is a plan view showing the reticle stage. In FIG. 2B, the reticle micro driving stage 11 is mounted on the reticle Y-axis driving stage 10, and the reticle R is held on the reticle micro driving stage 11. Also, X-axis mirror 21x, extending in the Y direction, is fixed at the positive X-direction end of the reticle micro driving stage 11. Two Y-axis mirrors 21y1, 21y2, in the form of corner cube, are fixed at the positive Y-direction end of the reticle micro driving stage 11. The mirror 21x is irradiated with a laser beam LRx that is incident in the negative X-direction, and the mirrors 21y1, 21y2 are irradiated with two parallel laser beams LRy1, LRy2 that are incident in the negative-Y direction. The laser beams LRx, LRy1, LRy2 are emitted by respective interferometers, which are collectively represented by the reticle interferometer 14 in FIG. 1. As in the case of the wafer stage above, the average value YR (referred to as "Y coordinate of the reticle stage") derived by taking an average of values $y_1$, and $y_2$ measured by two interferometers that use the laser beam LRy1 and LRy2, respectively, is used as the Y coordinate of the reticle micro driving stage 11, and the coordinate value XR measured by an interferometer that uses the laser beam LRx is used as the X coordinate of the reticle micro driving stage 11. Similarly, the rotational angle is obtained from a difference between the coordinate values $y_1$, and $y_2$, for example.

The laser beams LRy1, LRy2 reflected by the mirrors (corner cubes) 21y1, 21y2 are subsequently reflected by reflecting mirrors 27, 28, respectively, and are returned to the respective interferometers for detecting the position of the reticle stage in the Y direction (scanning direction). Thus, the Y-axis interferometers for the reticle are double-path type interferometers, and accordingly the variations or shifts in the position of the laser beams do not arise even when the reticle micro driving stage 11 is rotated.

A rectangular illumination area 26 on the reticle R is irradiated with exposure light EL, and detection areas 19R, 20R, at which the reticle alignment systems 19, 20 detects the positions of alignment marks, respectively, are arranged at the two ends of the illumination area 26. The illumination area 26 is conjugate with the exposure area 26W of FIG. 2A, and the detection areas 19R, 20R are conjugate with the detection areas 19W, 20W of FIG. 2A, respectively. Accordingly, the reticle R and the wafer stage (or wafer itself) can simultaneously be observed through the detection areas 19R and 20R. For example, cross-shape reticle alignment marks 29A, 29B may be formed near the edges of the pattern area of the reticle R, as shown in FIG. 2C. The spacing between the reticle alignment marks 29A, 29B may be set substantially equal to the spacing between the images of the fiducial marks 30A, 30B on the fiducial mark plate 6 of FIG. 2A when the images are projected back onto the reticle.

A control system for the wafer and reticle stages of the scanning exposure apparatus of the present embodiment will be described in more detail. Since the positions of the stages in the non-scanning direction (X direction) are controlled merely by correcting minute positional deviations during scanning exposure, a control system for controlling the position in the scanning direction (Y direction) will be mainly explained.

Figure 3:
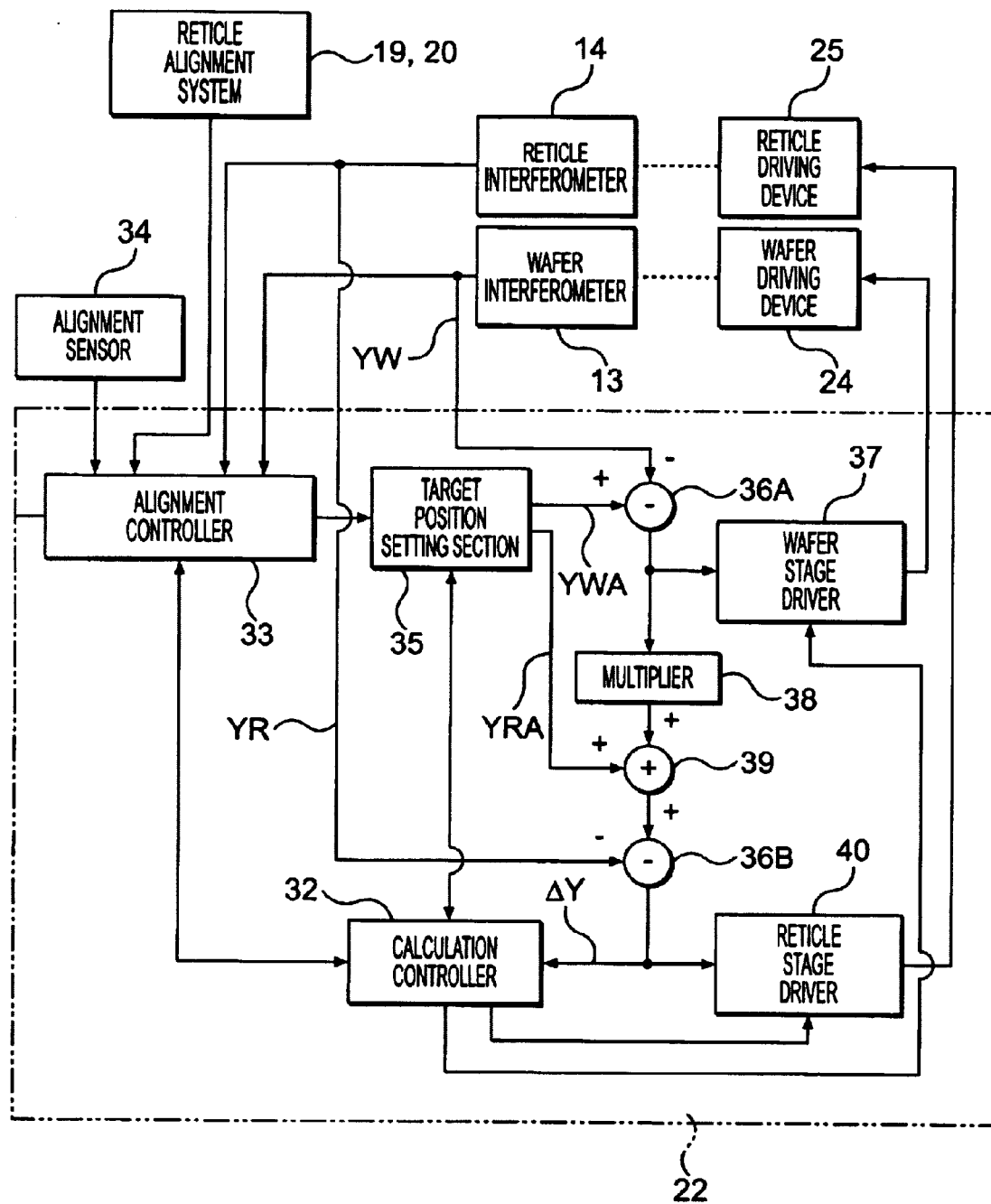
FIG. 3 is a schematic block diagram showing a control system for a stage system of the projection exposure apparatus of FIG. 1.

FIG. 3 shows a block diagram of the control system including functional blocks of the main control system 22 of FIG. 1. In FIG. 3, the main control system 22 includes a calculation controller 32 for controlling the entire apparatus, alignment controller unit 33, target position setting unit 35. The alignment control unit 33 receives image signals from the reticle alignment systems 19, 20 and image signals from the off-axis alignment sensor 34, and also receives measured coordinate values (Y coordinate YR of the reticle stage and Y coordinate YW of the wafer stage) from the reticle interferometer 14 and wafer interferometer 13. On the basis of the information thus received, the alignment control unit 33 calculates a positional deviation between the compared alignment marks and transmits the result to the calculation controller 32 for alignment of the reticle. For alignment of the wafer, the alignment control unit 33 calculates the positional relationship between the coordinates of the reticle stage and the coordinates of the wafer stage for aligning the reticle R with the wafer W, and transmits the resulting information indicating the positional relationship to the target position setting unit 35 and the calculation control unit 32. The target position setting unit 35 also receives from the calculation control unit 32 such information as the scanning speed of the wafer stage during scanning exposure, an initial value of the run-up distance, the length of each shot area as measured in the scanning direction (Y-direction), the length of the rectangular exposure area 26W of FIG. 2A in the scanning direction, and a distance corresponding to a predetermined margin used in determining the total run-up distance using a learning scheme, which will be described below. On the basis of the information thus received, the target position setting unit 35 determines the initial values $YWA_0$, $YRA_0$ of the positions of the wafer stage and reticle stage. The initial values $YWA_0$, $YRA_0$ represent acceleration starting positions (run-up starting positions) for wafer W and reticle R, respectively.

The target position setting unit 35 produces a target Y-coordinate value YWA for the wafer stage and a target Y-coordinate value YRA for the reticle stage. These target values for the Y-axis positions are constantly changed with time during a scanning exposure operation. The target value YWA is supplied to the first input terminal of a subtracter 36A, and the target value YRA is supplied to the first input terminal of an adder 39. The measured Y coordinate YW is supplied from the wafer interferometer 13 to the second input terminal of the subtracter 36A. At the subtracter 36A, a difference $\Delta YW$ (=YWA−YW) is calculated and is supplied to a wafer stage driver 37 and a multiplier 38. The wafer stage driver 37 then controls the wafer drive device 24 to drive the wafer Y-axis driving stage 2 in the Y direction by the distance $\Delta YW$. This sequence of steps is carried out many times almost continuously to accelerate the wafer Y-axis driving stage 2 to a predetermined scanning speed.

The multiplier 38 supplies the second input terminal of the adder 39 with a value obtained by multiplying the inverse ($-1/\beta$) of the magnification $\beta$ of the projection optical system 8 (for projection from the reticle R to the wafer W) by the difference $\Delta YW$. The minus sign of the inverse ($-1/\beta$) indicates that the projection optical system 8 performs inverse projection. The adder 39 supplies the sum (YRA−$\Delta YW/\beta$) of the two input values to the first input terminal of the subtracter 36B. By this operation, the position of the reticle stage is going to be shifted by an amount corresponding to the positional deviation of the wafer stage from the target value.

The Y coordinate YR of the reticle stage measured by the reticle interferometer 14 is supplied to the second input terminal of the subtracter 36B, and a difference $\Delta YR$, which is expressed by the following equation (1), is calculated at the subtracter 36B.

$$\Delta YR = YRA - \Delta YW/\beta - YR \qquad (1)$$

The difference $\Delta YR$ represents a positional deviation of the reticle stage from the target position that takes into account the actual position of the wafer stage: i.e., a synchronization error in the scanning direction. Thereafter, the difference $\Delta YR$ will also be referred to as a synchronization error $\Delta Y$. The synchronization error $\Delta Y$ is supplied to the reticle stage driver 40 and the calculation control unit 32. In accordance with the error $\Delta Y$, the reticle stage driver 40 controls the reticle drive device 25 to drive the reticle Y-axis driving stage 10 and the reticle micro driving stage 11 to offset the synchronization error $\Delta Y$. For example, the reticle Y-axis driving stage 10 (or reticle scanning stage) is moved in the Y direction at a predetermined acceleration or predetermined scanning speed, and the reticle micro driving stage 11 is driven to correct residual small errors. In this manner, the wafer W and reticle R are moved relative to each other at the speed ratio corresponding to the projection magnification $\beta$ of the projection optical system 8, while being aligned with each other. When other operations, such as initial alignment, etc., are performed, the calculation control unit 32 can control the movements of the wafer stage and reticle stage directly through the wafer stage driver 37 and reticle stage driver 40.

An example of alignment and scanning exposure operations performed by the scanning exposure apparatus of the present embodiment will now be explained. First, reticle alignment is explained. To perform the reticle alignment, the fiducial mark plate 6 is moved to the exposure area of the projection optical system 8 to position the fiducial marks 30A, 30B (FIG. 2A) inside the exposure area. The fiducial marks 30A, 30B and the reticle alignment marks 29A, 29B (FIG. 2C) on the reticle R are simultaneously detected by the reticle alignment systems 19 and 20. Then, the alignment control unit 33 of FIG. 3 derives positional misalignment between these two pairs of the marks, and supplies the result to the calculation control unit 32. The calculation control unit 32 controls the reticle stage driver 40 to adjust the position of the reticle R so that the alignment marks 29A, 29B are aligned with the fiducial marks 30A, 30B. In this way, the position of the reticle R is determined with reference to the fiducial marks 30A, 30B (reticle alignment).

In this aligned condition, the fiducial mark 31 on the fiducial mark plate 6 of FIG. 2A is located within the detection area of the alignment sensor 34 so that the sensor 34 can capture the image of the fiducial mark 31 at the same time. This image signal from the alignment sensor 34 is supplied to the alignment control unit 33 of FIG. 3. The alignment control unit 33 then derives a positional deviation of the image of the fiducial mark 31 from the predetermined detection center of the alignment sensor 34 based on the image signal, and adds the deviation to a known positional relationship between the center of the fiducial marks 30A, 30B and the fiducial mark 31 to obtain a so-called baseline amount of the alignment sensor 34.

Subsequently, wafer marks (wafer alignment marks) formed on a plurality of certain shot areas on the wafer W are moved to the detection area of the alignment sensor 34 to capture the images of the wafer marks, and the resultant image signals are supplied to the alignment control unit 33. The alignment control unit 33 then calculates the coordinates of the respective wafer marks by adding a positional deviation of the wafer mark obtained from the image signals to the X and Y coordinates of the wafer stage measured by the wafer interferometer 13. Then, the thus obtained coordinates of the plurality of wafer marks are statistically processed to derive array coordinates indicating the center positions of respective shot areas on the wafer using an enhanced global alignment method (EGA), for example. By shifting these array coordinates by the baseline amount obtained above, the projected image of the reticle pattern on the reticle R can be accurately aligned with each shot area on the wafer. The alignment control unit 33 supplies the target position setting unit 35 with the Y coordinate YRAL and X coordinate XRAL of the reticle stage obtained when the reticle R is positioned with respect to the fiducial marks 30A, 30B, and shifted array coordinates obtained by shifting the array coordinates of each shot area by the baseline amount, for example.

Suppose that the first shot area on the wafer W is about to be exposed to exposure light. Then, the target position setting unit 35 calculates the initial value (acceleration starting position) $YWA_0$ for the Y coordinate of the wafer stage according to the following expression.

$$YWA_0 = YWX1 - (YSA + YSL)/2 - LA, \qquad (2)$$

where YWX1 represents Y coordinate of the shifted array coordinates for the first shot area, YSA represents the length of the shot area along the Y direction, YSL represents the length of the exposure area 26W along the Y direction, and LA represents an initial value of the run-up distance of the wafer stage.

Similarly, the initial value (acceleration starting position) $YRA_0$ for the Y coordinate of the reticle stage is calculated according to the following expression.

$$YRA_0 = YRAL + \{(YSA+YSL)/2 + LA\}/\beta \quad (3)$$

The target position setting unit 35 then supplies these initial values $YWA_0$ and $YRA_0$ to the input terminal of the subtracter 36A and the input terminal of the adder 39 (FIG. 3), respectively. Similarly, the initial values in the X direction are also calculated. Subsequently, the wafer stage and reticle stage are moved to the respective acceleration starting positions.

Although the wafer stage can be considered to be at rest at the acceleration starting position for simplicity, the wafer stage may be accelerated immediately after reaching the acceleration starting position. Normally, the scanning direction of the reticle stage is alternately reversed while a plurality of shot areas are successively exposed. A reverse position at which the scanning direction is reversed (instantaneous standstill position) may be regarded as the acceleration starting position, or a position to which the stage returns by some distance from the reverse position may be regarded as the acceleration starting position.

Figure 4:
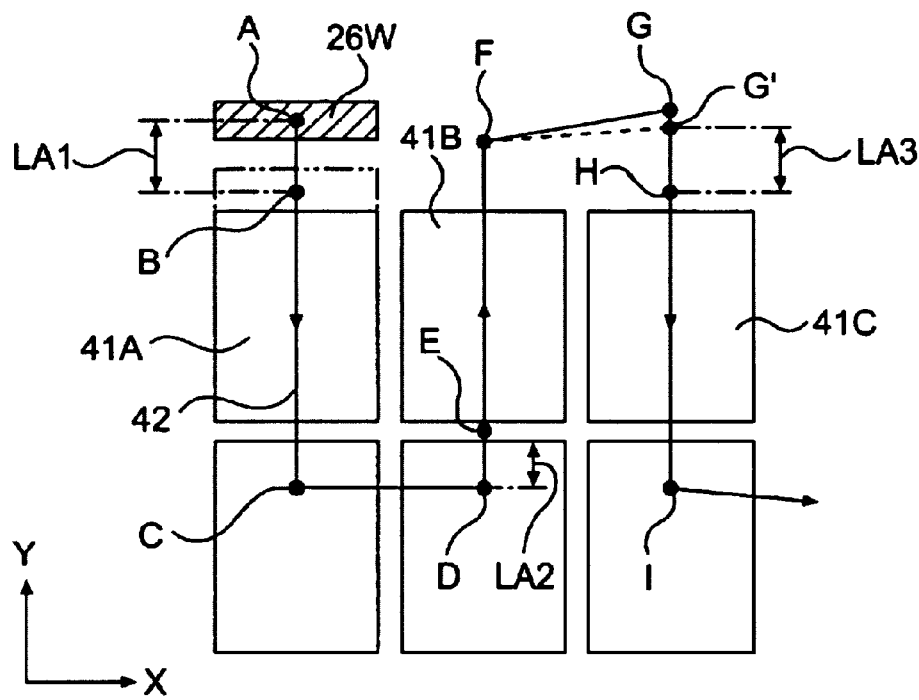
FIG. 4 is a plan view showing a path of an exposure area when scanning exposure is conducted with respect to a plurality of shot areas on a wafer according to the present invention.

FIG. 4 shows a situation where the wafer stage is set to the acceleration starting position. In FIG. 4, the first shot area 41A and the following shot areas 41B, 41 C, . . . are arranged in the X direction at a predetermined pitch, and similar shot areas are also arranged in the Y direction at a predetermined pitch. When the wafer stage is located at the acceleration starting position with respect to the first shot area 41A, the center of the rectangular exposure area 26W is located at point A. Although in the actual scanning exposure apparatus, the exposure area 26W is at rest and the wafer stage (wafer) is moved, FIG. 4 illustrates movement of the exposure area 26W relative to the wafer W, i.e., the motion of the exposure area 26W in the wafer rest frame. In FIG. 4, the exposure area 26W moves along a path 42. When the exposure area 26W is located at the exterior of the shot areas 41A, 41B, . . . , exposure light forming the exposure area 26W is shut off to avoid accidental exposure of the shot areas that may occur by undesirable light scattering or the like.

After the target position setting unit 35 informs the calculation control unit 32 of the start of acceleration, the target Y coordinate YWA of the wafer stage supplied from the subtracter 36A is rapidly changed from the initial value $YWA_0$ based on a predetermined acceleration characteristic, and at the same time, the Y coordinate YRA of the reticle stage supplied to the adder 39 is changed to satisfy the following relationship.

$$YRA - YRA_0 = -(YWA - YWA_0)/\beta \quad (4)$$

Thus, the wafer stage (and wafer W) and the reticle stage (and reticle R) are accelerated in synchronization with each other until they reach respective predetermined scanning speeds. Once these stages reach the respective scanning speeds, the target position setting unit 35 changes the target Y coordinate YWA of the wafer stage in proportion to time (the proportion coefficient is scanning speed), and the target Y coordinate YRA of the reticle stage supplied to the adder 39 is also changed according to the change in the Y coordinate YWA. Thus, the wafer stage and reticle stage are moved relative to each other at the constant scanning speeds with the speed ratio equal to the projection magnification $\beta$.

Meanwhile, the reticle stage driver 40 controls the reticle drive device 25 in FIG. 3 to eliminate the synchronization error $\Delta Y$ derived at the subtracter 36B. After empirically known time period (settling time) during which the synchronization error $\Delta Y$ is supposed to settle within a predetermined tolerance, the reticle and wafer stages reach their respective exposure starting positions from which illumination with the exposure light is initiated. In FIG. 4, when both stages reach their respective exposure start positions, the center of the exposure area 26W reaches the point B located just ahead of the shot area 41A. In FIG. 4, LA1 represents a run-up distance from the run-up start position (acceleration starting position) of the wafer stage to the exposure starting position for the shot area 41A, and this run-up distance LA1 includes a settling distance (settling time×scanning speed). Then, the exposure area 26W moves towards the shot area 41A for scanning exposure, so that the pattern of the reticle R is transferred onto the shot area 41A.

Figure 5A:
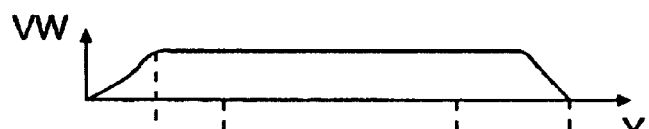
FIG. 5A shows the scanning speed of the wafer versus the Y coordinate.
Figure 5B:
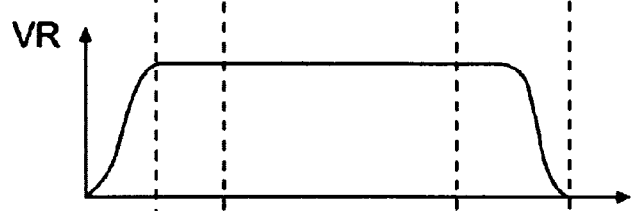
FIG. 5B shows the scanning speed of the reticle versus the Y coordinate.
Figure 5C:
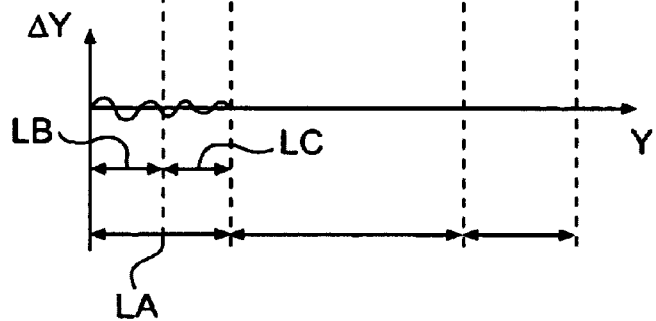
FIG. 5C shows a synchronous error between the wafer and the reticle.

FIGS. 5A, 5B, and 5C show the scanning speed VW of the wafer stage (wafer W), the scanning speed VR of the reticle stage (reticle R), and the associated synchronization error $\Delta Y$, respectively, with respect to the Y-coordinate in the scanning direction. In FIGS. 5A–5C, the horizontal axis represents the Y coordinate of the wafer stage, and "LB" represents an acceleration distance, which is an interval between the acceleration starting point and a point where both stages reach their respective scanning speeds. Reference letter "LC" represents a settling standby distance (or settling distance), which is an interval between the point where the stages reach their scanning speeds and the exposure starting point. Furthermore, "LA" represents the run-up distance that is the sum of the acceleration distance "LB" and the settling standby distance "LC." To obtain the setting standby distance "LC" above, a predetermined margin is added to the settling distance required for the synchronization error $\Delta Y$ to settle within a fixed tolerance. The purpose of adding this margin is to ensure the synchronization error $\Delta Y$ between the wafer stage and the reticle stage to settle within the allowable range even when small errors arise in determining the settling distance.

Figure 6A:
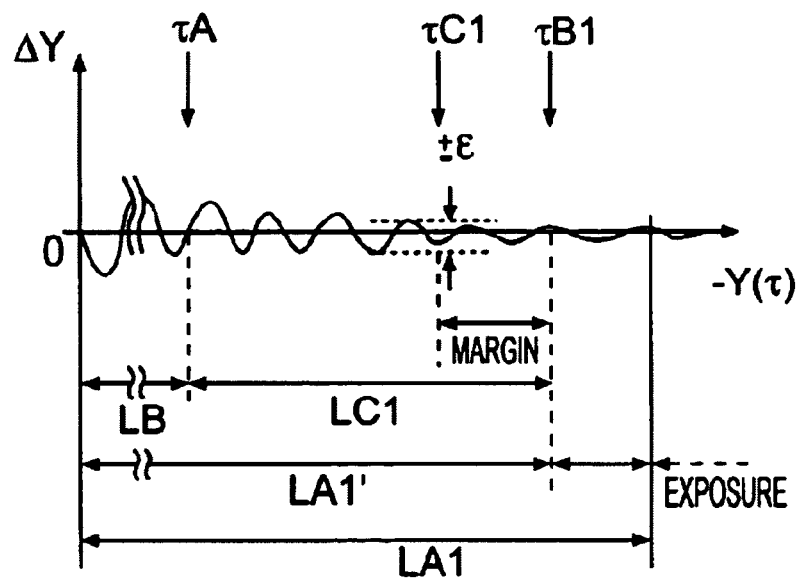
FIG. 6A shows a synchronous error during scanning exposure on the first shot area of FIG. 4.

FIG. 6A is an enlarged graph showing the synchronization error $\Delta Y$ detected over the run-up distance LA1 of FIG. 4. The horizontal axis of FIG. 6A represents the Y coordinate of the wafer stage, but may also be considered to be time t with the origin of the horizontal axis indicating time 0 since the Y coordinate varies with time t. In FIG. 6A, both stages reach their scanning speeds at time tA. The synchronization error $\Delta Y$ settles within a tolerance ($\pm\epsilon$) at time tC1 (referred to as "actual acceleration settling time"), and the exposure operation starts at time tB1. The calculation control unit 32 of FIG. 3 detects the time tC1 when the synchronization error $\Delta Y$ settles within the tolerance, and stores it in an internal or external memory. As shown in FIG. 6A, the run-up distance LA1 is longer than the run-up distance LA1' that would be sufficient for the synchronous error to settle within the tolerance. The thus obtained time tC1 is supplied to the target position setting unit 35.

Referring to FIG. 4, after the entire reticle pattern is transferred onto the shot area 41A and the exposure area 26W passes the shot area 41A, the wafer stage and reticle stage are decelerated, and both stages come to a stop when the exposure area 26W reaches point C. Then, the wafer X-axis driving stage 3 and wafer Y-axis driving stage 2 perform stepping movements to move the wafer stage (wafer W) to the acceleration starting position for the next second shot area 41B. Alternatively, the wafer stage may start moving to the next acceleration starting position for the shot area 41B without making a stop at point D.

Since the scanning direction is reversed at this time, the target position setting unit 35 uses the same run-up distance LA1 as the run-up distance LA2 and starts accelerating the wafer and reticle stages. In FIG. 4, the exposure area 26W starts being accelerated from point D, and transfer of the reticle pattern onto the second shot area 41B is initiated when the exposure area 26W reaches point E. After the exposure of the shot area 41B is completed, the exposure area 26W stops at point F. Meanwhile, the calculation control unit 32 of FIG. 3 measures actual settling time during which the synchronization error ΔY actually settles within the predetermined tolerance.

Figure 6B:
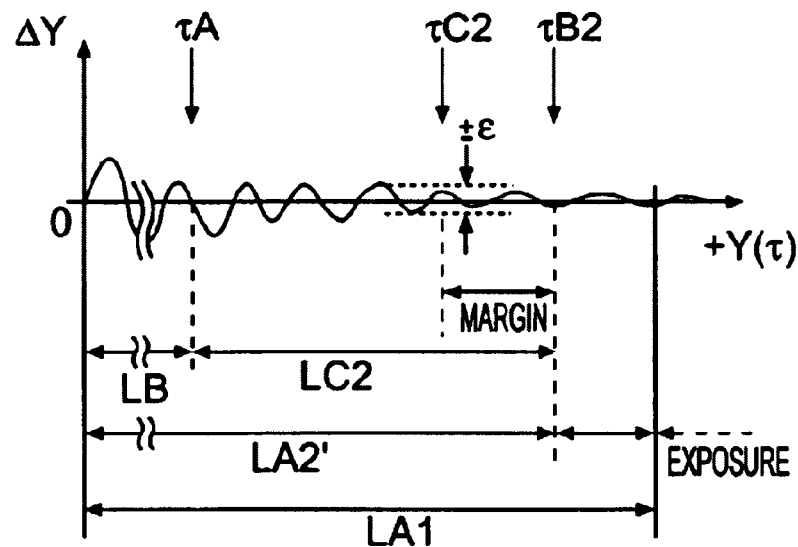
FIG. 6B shows a synchronous error during scanning exposure on the second shot area of FIG. 4.

FIG. 6B shows the measured synchronization error ΔY when the shot area 41B is scanned. The Y coordinate on the horizontal axis of FIG. 6B represents an absolute value of displacement from the acceleration starting position. The actual measured acceleration settling time tC2 in FIG. 6B is somewhat different from that of FIG. 6A. The measured time tC2 is stored and supplied to the target position setting unit 35.

Thereafter, the wafer stage is moved stepwise to the next acceleration starting position to scan-expose the third shot area 41C of FIG. 4. To determine the acceleration starting position at this time, the target position setting unit 35 first determines a run-up distance LA3 (FIG. 6C) by adding the predetermined margin to a distance corresponding to the measured acceleration settling time tC1 measured upon scanning the first shot area 41A. The measured LA1 for the first shot area is used here because the scanning direction of the shot area 41C is the same as that of the shot area 41A. In this case, the run-up distance for the reticle stage is LA3/β. The distance LA3 should be normally shorter than the initial value LA1 of the run-up distance. If the run-up distance LA3 is longer than the initial value LA1, this may be due to problems in the stage system or other parts of the apparatus, and therefore an alarm may be turned on to inform the operator of the problem.

If LA3 is smaller than LA1, the target position setting unit 35 substitutes the run-up distance LA3 for the initial run-up distance LA in Equations (2), (3) above, and uses the coordinates of the third shot area 41C as the array coordinates to obtain the coordinates of the acceleration starting positions of the wafer stage and the reticle stage for scanning the shot area 41C. The resultant coordinates are then supplied to the subtracter 36A and the adder 39.

Then, the exposure area 26W moves along the dotted line 43 to reach point G' located ahead of the third shot area 41C, as shown in FIG. 4. Thereafter, the target position setting unit 35 constantly changes the target coordinates to move the reticle and wafer stages. When the exposure area 26W is moved by the run-up distance LA3 and reaches point H, illumination with the exposure light is started. Scanning exposure operation with respect to the shot area 41C is completed when the center of exposure area 26W reaches point I. If instead, the initial value LA1 is used as the run-up distance, the acceleration starting position would be at point G, which has a longer distance from the shot area 41C than point G'. Thus, according to the present embodiment, the time required for traveling from the acceleration starting point to the exposure starting point can be reduced, and the throughput of the exposure process can be improved. Further, since the synchronization error ΔY can be kept within the tolerance, misalignment can also be kept within a certain tolerance.

Similarly, to determine the acceleration starting position for the fourth shot area (not shown in the figure), the target position setting unit 35 calculates a new run-up distance based on the measured acceleration settling time tC2 (FIG. 6B) for the second shot area 41B. The measured value for the second shot area is used here because the scanning direction of the fourth shot area is the same as that for the second shot area. In a similar manner, the run-up distances for the subsequent shot areas are determined based on the actual acceleration settling times measured during scanning exposure of the previous shot areas. For example, for the fifth shot area and after, the run-up distance for that shot area may be determined based on the worst acceleration settling time among the measured acceleration settling times at a plurality of shot areas that are previously scanned in the same direction as the shot area to be exposed.

In the present embodiment above, when scanning exposure is conducted with respect to each shot area on a single wafer W, the run-up distance (and acceleration starting position) is determined based on the actual acceleration settling time measured for the previously exposed (scanned) shot areas. Thus, the acceleration starting position can be set to an optimum position due to the learning effect, thus improving the throughput while confining the alignment error within a predetermined tolerance.

In the illustrated embodiment above, the actual acceleration settling time is separately measured for each scanning direction, and the run-up distance for each scanning direction is calculated based on the corresponding measurement result. If it is known in advance that the acceleration settling time differs little with the scanning direction, however, the run-up distance (acceleration starting position) for the next shot area may be determined based on the worst or largest value of the actual acceleration settling times that have been measured for all the previous shot areas regardless of the scanning direction.

Also, if the actual measured acceleration settling time varies little among the shot areas, the run-up distance for the next shot area may be calculated based on the average value of the actual acceleration settling times of the previously exposed shot areas, for example.

Typically, a plurality of wafers included in one lot are successively exposed. In this case, shot areas on a first wafer may be scan-exposed using the predetermined initial run-up distances, and at the same time, the actual acceleration settling time for each shot area may be measured and stored. Then, when a second wafer is processed, the optimum run-up distance (acceleration starting position) for each shot area may be determined based on the acceleration settling time measured for the corresponding shot area of the first wafer, for example. As for the third and subsequent wafers, the run-up distance for each shot area may be determined based on the worst or average value of the acceleration settling times measured for the corresponding shot areas of previously processed wafers. In this manner, even when the acceleration settling times differ with the shot area on the wafer, the run-up distance for each shot area can be reduced to an optimum value, thereby improving the throughput.

Alternatively, if the actual acceleration settling time varies little with the shot area positions in the wafer, the run-up distance for the second and subsequent wafers may be determined based on the worst (or average) value of the actual acceleration settling times measured for the shot areas of the previously processed wafers. Thus, the present invention is not limited to the illustrated embodiment, but may be embodied with various changes or modifications, without departing from the principle of the invention.

According to the scanning exposure method of the present invention, the acceleration starting positions (run-up distances) for the shot areas are determined using a learning scheme based on the actual acceleration settling time measured for the previously exposed shot area. Therefore, the acceleration starting position can be made closer to the shot area to be exposed, while ensuring the synchronization error to settle within the tolerance before exposure is actually started. Thus, the run-up distances in scanning exposure operations can be advantageously shortened without sacrificing the synchronization error. This results in significant improvement on the throughput.

The acceleration starting positions of the mask and the second wafer (or photosensitive substrate) are determined based on the acceleration settling time such that each of the acceleration starting positions is located ahead of a corresponding exposure start position with a spacing obtained by adding a predetermined margin to a distance over which each of the mask and photosensitive substrate travels within the acceleration settling time. This way, it is possible to ensure that the synchronization errors settle within the tolerance.

When a plurality of wafers are to be processed, actual acceleration settling times measured during exposure of previously processed wafers may be used to determine the optimum acceleration settling times for a new wafer through the learning scheme.

Also, the scanning exposure apparatus of the present embodiment is able to implement the scanning exposure method of the present invention.

Second Preferred Embodiment

Figure 7:
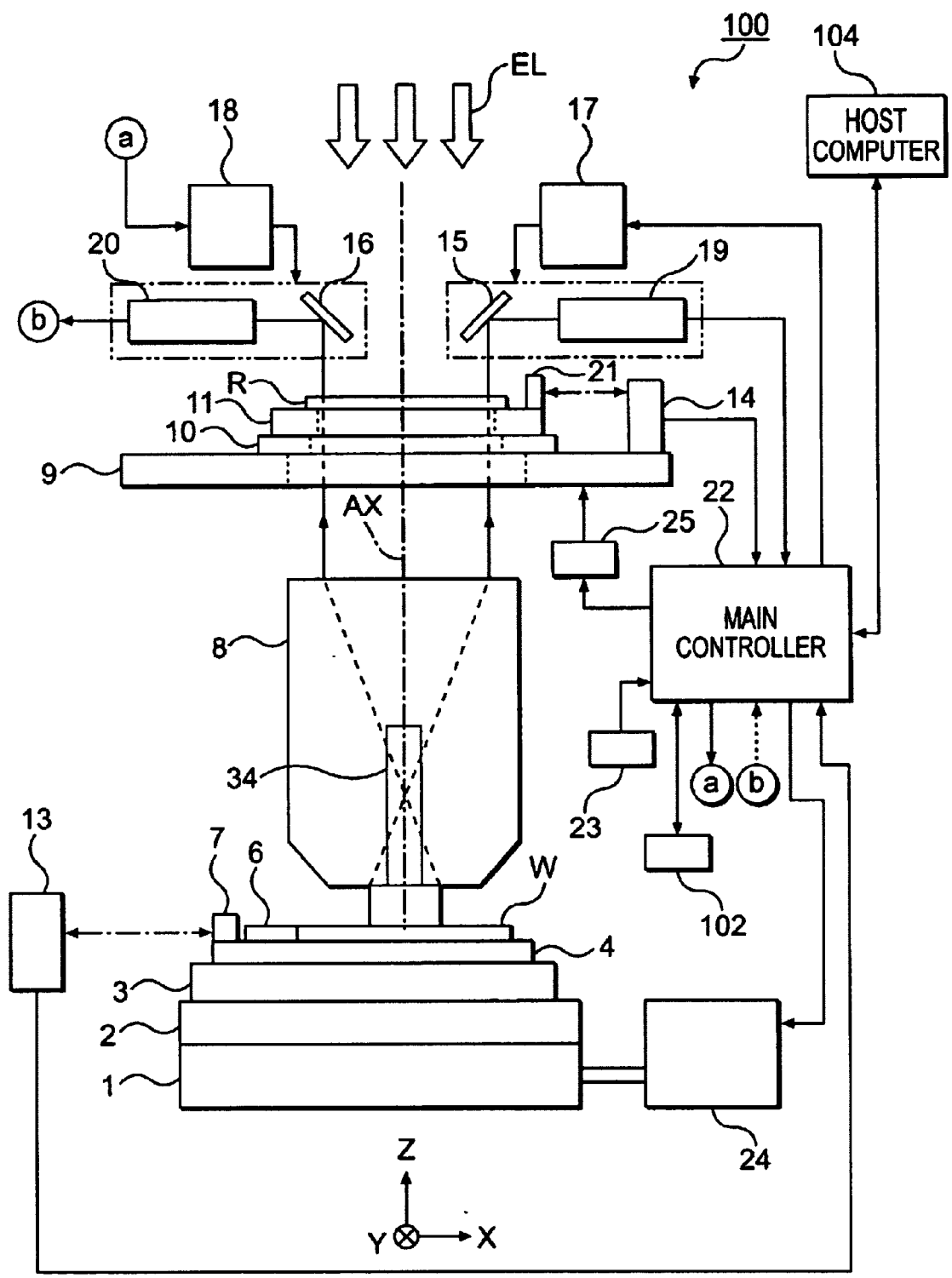
FIG. 7 schematically shows the whole construction of a scanning exposure apparatus according to a second preferred embodiment of the present invention.

A second preferred embodiment of the present invention is described with reference to FIGS. 7 and 8. FIG. 7 schematically shows the construction of a scanning exposure apparatus according to the second preferred embodiment of the invention. In the present embodiment, in addition to the structure described with reference to FIG. 1, a memory 102 and a host computer 104 are connected to the apparatus.

In the present embodiment, the main control system 22 includes a microcomputer, minicomputer, or the like, that controls the overall operations of the exposure apparatus. During scanning exposure, for example, the main control system 22 controls wafer drive device 24 and the reticle drive device 25 to move the wafer W at a constant speed V in the positive Y direction (or negative Y direction), and move the reticle R at a constant speed V/β in the negative Y direction (or positive Y direction) in synchronization with the wafer W. As in FIG. 1, an input device 23 is connected to the main control system 22 for an operator to enter various commands or the like.

In the present embodiment, the main control system 22 is equipped with a memory 102 as a storage device. The memory 102 stores data representing the settling times (each indicates a time interval necessary for synchronization errors to settle within a predetermined tolerance after the reticle and wafer are accelerated to the respective target speeds) together with certain parameters on which each settling time may depend. For example, each settling time is stored in the memory 102 together with three parameters, (1) the position of the wafer stage, i.e., the position of the relevant shot area on the wafer W, (2) the scanning speed, and (3) the scanning direction.

To obtain the data stored in the memory, for example, the reticle stage and wafer stage are moved relative to each other in a manner similar to that in the actual scanning exposure operation under various scanning conditions (the scanning speed and the scanning direction, etc.), and the settling time is measured for each shot area and stored in the memory 102 in the form of a table or the like. To obtain reliable and accurate data of the settling times, it is desirable to perform the above measurement many times (several dozens to several hundreds, for example) for each condition, and derive the averaged or maximum value (excluding apparent measurement errors from the data) as the settling time required for the synchronization error to settle within the allowable range The three parameters (1), (2), (3) discussed above are used in the present embodiment since these parameters are generally considered to be dominant factors that influence the settling time, and also need to be changed frequently depending on the processing specifications. Furthermore, the influence of these parameters on the settling times varies from one exposure apparatus to another, and therefore it is difficult to determine the settling times without actually measuring the settling times.

With regard to parameter (1), the position of the wafer stage (including the positions of the X-axis driving stage and Y-axis driving stage) varies depending on which shot area is exposed, and the position of the center of gravity of the apparatus and vibrations in the apparatus depend on the position of the wafer stage. With regard to parameter (2), the settling time naturally varies with the scanning speed, and the scanning speed needs to be changed if the intensity of exposure light is changed according to the sensitivity of the photoresist used or if the intensity of exposure light changes from the initial value. With respect to parameter (3), characteristics of respective drive mechanisms slightly vary depending upon the scanning directions of the reticle stage and the wafer stage (positive Y direction or negative Y direction).

In addition to the parameters (1) to (3) as described above, other parameters, such as (4) the accelerations of the reticle stage and the wafer stage and (5) the length of the shot area in the scanning direction, may also be included in the parameters to be considered.

In this embodiment, the data in a table format indicating the measured settling times with respect to all combinations of the above parameters are stored in the memory 102. Alternatively, data of the settling time may be stored in a different manner. For example, data of the settling time that is actually measured for each shot area during scanning operation at a reference scanning speed in a given scanning direction may be stored in the memory 102, and coefficients that numerically represent influences of the parameters (2), (3) on the settling time may be stored in the memory 102 instead of actually storing the settling times under different conditions.

Figure 8:
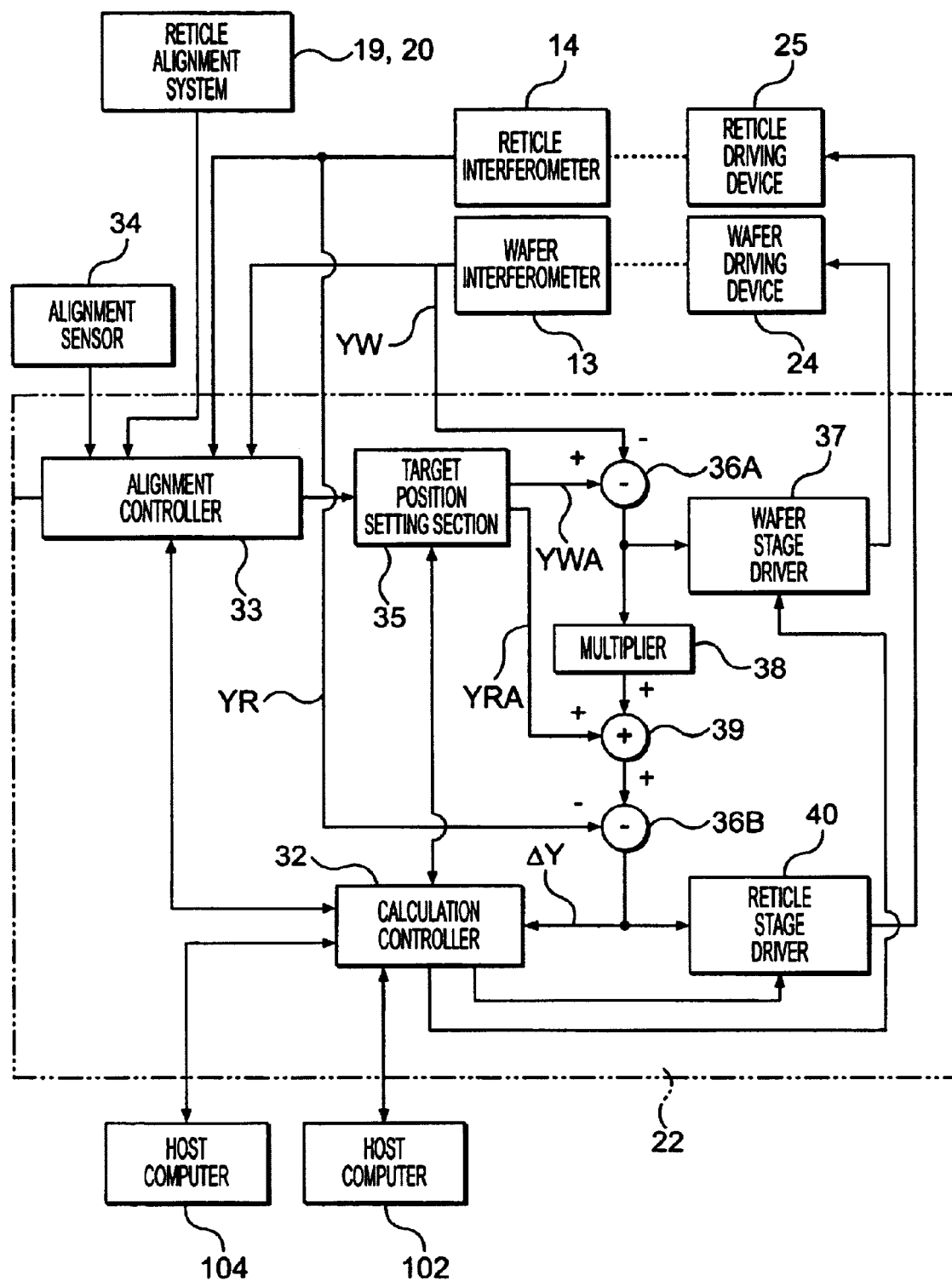
FIG. 8 shows a block diagram showing one example of the construction of a main control system of FIG. 7 and other constituent parts associated with respective functional units of the main control system of FIG. 7.

FIG. 8 schematically shows a block diagram including a main controller 22 of the present embodiment. In addition to the elements described with reference to FIG. 3, the present embodiment includes a memory block 102 and a host computer 104, both of which communicate with the calculation control unit 32.

When the calculation control unit 32 receives an exposure command (a command initiating exposure operation) from the host computer 104 (host device), the calculation control unit 32 controls a wafer stage driver 37 and a reticle stage driver 40 while confirming the positions of the substrate table 4 and reticle micro driving stage 11 based on the positional information supplied from the alignment control unit 33. The calculation control unit 32 reads out from the memory 102 the scanning speed of the substrate table 4 during the scanning exposure stage, and acceleration of the wafer stage during the acceleration stage. The calculation control unit 32 further reads out from the memory 102 the length of each shot area along the scanning direction, the length of the rectangular exposure area 26W (FIG. 2A) along the scanning direction, and the settling time stored under the corresponding conditions (the position of the shot area, scanning speed, and scanning direction, which can influence the settling time). The calculation control unit 32 then transmits these data to the target position setting unit 35. Other elements of FIG. 8 operate in similar manners to those same elements of FIG. 3.

Figure 6C:
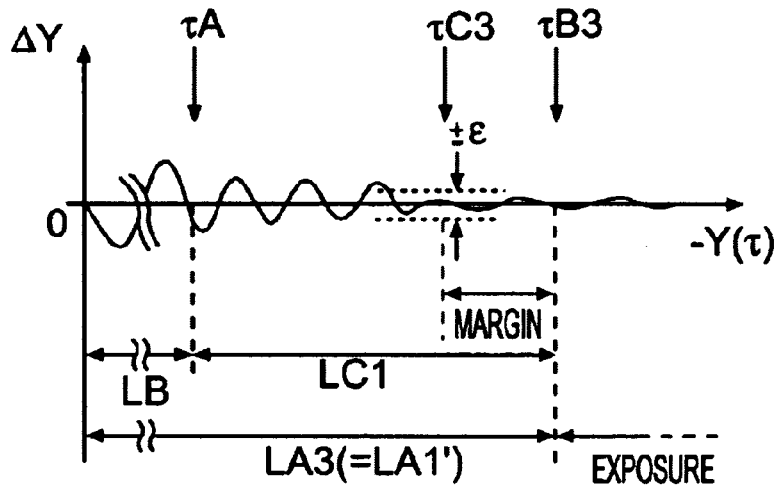
FIG. 6C shows a synchronous error during scanning exposure on the third shot area of FIG. 4.

Next, referring to FIGS. 6A to 6C, operation of the present embodiment including the method of determining the run-up, distances LA1, LA2, LA3 for the respective shot areas and the method of calculating the run-up start position based on these distances will be explained.

As described above, the memory 102 stores data indicating the settling times measured in advance for each shot area under various conditions, such as the various scanning speeds and various scanning directions. In particular, the data stored in this memory 102 include data indicating the settling time that has been measured for the shot area 41A by scanning it in the same scanning direction (negative Y direction) and at the same scanning speed as the scanning conditions under which the shot area 41A will actually be exposed. This settling time corresponds to (tC1−tA) in FIG. 6A. Prior to actual scanning exposure of the shot area 41A, the calculation control unit 32 reads out this particular data (tC1−tA) (that has been measured under the conditions corresponding to the exposure conditions of the shot area 41A; the exposure conditions include the scanning speed, scanning direction, and the position of the shot area, etc.) from the memory 102, and provides the data to the target position setting unit 35. The actual exposure conditions may be included in an exposure command sent from the host computer 104, or may be inputted by an operator through the input device 23.

Upon receipt of the data indicating the settling time as well as the exposure conditions, the target position setting unit 35 calculates the acceleration distance LB from the target speed (scanning speed) and a predetermined acceleration rate, and also derives the settling distance LC1 by multiplying {the settling time tC1−tA+a predetermined margin} by the scanning speed. The target position setting unit 35 then calculates the run-up distance LA1 by adding the acceleration distance LB and settling distance LC1, and determines the run-up start positions for the reticle stage and wafer stage by substituting thus obtained LA1 for LA in the Equations (2), (3) discussed in reference to the first preferred embodiment section above. Using these the run-up start positions the wafer stage is moved to the run-up start position for the exposure of the shot area 41, so that the center of the exposure area 26W is located at the point A in FIG. 4.

In the memory 102, a value obtained by adding a predetermined margin (tB1−tC1 in FIG. 6A) to the above-described settling time tC1−tA may be stored as the settling time instead of the time interval tC1−tA. Alternatively, if the acceleration and target speed (scanning speed) in the run-up period are invariant, and as a result, the acceleration distance LB is invariant, the sum of the settling time and the acceleration time or the run-up distance LA1 itself may be stored in the memory 102, instead of the bare settling time tC1−tA.

Referring to FIG. 6B, the method of determining the run-up distance LA2 for the shot area 41B will be explained. The data stored in this memory 102 include data indicating the settling time that has been measured for the shot area 41B by scanning it in the same scanning direction (positive Y direction this time) and at the same scanning speed as actual scanning conditions under which the shot area 41B will actually be exposed. This settling time corresponds to (tC2−tA) in FIG. 6B. Prior to actual scanning exposure of the shot area 41B, the calculation control unit 32 reads out this particular data (tC2−tA) (that has been measured under the conditions corresponding to the exposure conditions of the shot area 41B; the exposure conditions include the scanning speed, scanning direction, and the position of the shot area, etc.) from the memory 102, and provides the data to the target position setting unit 35.

Upon receipt of the data indicating the settling time as well as the exposure conditions, the target position setting unit 35 calculates the acceleration distance LB from the target speed (scanning speed) and a predetermined acceleration rate, and also derives the settling distance LC2 by multiplying {the settling time tC2−tA+a predetermined margin} by the scanning speed. The target position setting unit 35 then calculates the run-up distance LA2 by adding the acceleration distance LB and settling distance LC2, and determines the run-up start positions for the reticle stage and wafer stage by substituting thus obtained LA2 for LA in the Equations (2), (3) discussed in reference to the first preferred embodiment section above. Using these the run-up start positions the wafer stage is moved to the run-up start position for the exposure of the shot area 41B, so that the center of the exposure area 26W is located at the D point in FIG. 4.

The run-up distance LA3 for scanning the shot area 41C is determined in a similar manner. The data stored in this memory 102 include data indicating the settling time that has been measured for the shot area 41C by scanning it in the same scanning direction (negative Y direction this time) and at the same scanning speed as actual scanning conditions under which the shot area 41C will actually be exposed. This settling time corresponds to (tC3−tA) in FIG. 6C. Prior to actual scanning exposure of the shot area 41C, the calculation control unit 32 reads out this particular data (tC3−tA) (that has been measured under the conditions corresponding to the exposure conditions of the shot area 41C; the exposure conditions include the scanning speed, scanning direction, and the position of the shot area, etc.) from the memory 102, and provides the data to the target position setting unit 35.

Upon receipt of the data indicating the settling time as well as the exposure conditions, the target position setting unit 35 calculates the acceleration distance LB from the target speed (scanning speed) and a predetermined acceleration rate, and also derives the settling distance LC3 by multiplying {the settling time tC2−tA+a predetermined margin} by the scanning speed. The target position setting unit 35 then calculates the run-up distance LA3 by adding the acceleration distance LB and settling distance LC3, and determines the run-up start positions for the reticle stage and wafer stage by substituting thus obtained LA3 for LA in the Equations (2), (3) discussed in reference to the first preferred embodiment section above. Using these the run-up start positions the wafer stage is moved to the run-up start position for the exposure of the shot area 41C, so that the center of the exposure area 26W is located at the point G' in FIG. 4.

The run-up start position for the fourth shot area (not illustrated in the figure) is determined in a similar manner to that explained above. Thus, the wafer stage (wafer W) (and reticle stage) can be always set to run-up start positions suitable for the respective shot areas under particular exposure conditions by reading out from the memory 102 the settling times (or settling distances) that are measured for the shot area under the corresponding scanning conditions.

As is apparent from the above explanation, the main control system 22 plays a role of a stage control unit in the present embodiment.

In the scanning exposure apparatus of the present embodiment as described above, the settling times that are measured in advance for a plurality of shot areas under various exposure (scanning) conditions are stored in the memory 102. When the exposure apparatus 100 performs sequential scanning exposure with respect to a plurality of shot areas on the wafer W, therefore, the run-up start position for each shot area can be easily and accurately determined using the settling time corresponding to the shot area and the exposure conditions. Accordingly, actual exposure can be performed in the condition where the synchronization errors between the wafer W and reticle R including alignment errors are reduced to within given respective tolerances, thus achieving highly accurate scanning exposure.

Also, according to the present embodiment, since the run-up start position is optimized for each shot area under given exposure and scanning conditions, the throughput can be improved as compared with the conventional method of setting up the settling time in which the run-up start position is uniformly set on the basis of the worst or longest settling time.

In the second embodiment, the settling time measured in advance is stored as is in memory 102. The present invention is not limited to this. At least some of the parameters that influence the settling time for each shot area may be stored in memory 102 in the form of coefficients that numerically represent degrees by which those parameters influence the settling time. These coefficients can be determined by actually measuring the coefficients in advance. In this case, the settling time for establishing the run-up distance is determined by reading out these coefficients for the relevant exposure conditions from the memory, and calculating an estimated settling time by processing a basic settling time by these coefficients, for example. In this case, the run-up start positions can reflect peculiarity of each shot area, and accordingly the run-up distance can be optimized.

In the second preferred embodiment, the information stored in advance in memory 102 may be settling times, settling distances, run-up times, run-up distances, and/or other parameters, which can be used for deriving the settling time. Alternatively, if the scanning speed and the acceleration are substantially constant over all the shot areas, run-up start positions that allow the synchronization errors to settle within a predetermined tolerance may be calculated in advance for all the shot areas based on previously measured information, and thus optimized run-up start positions may be stored in memory 102.

Moreover, if a settling time necessary for each wafer position (shot area, for example) is known in advance, simplified settling time information that is obtained by adding a predetermined margin to the known settling time may be stored in memory 102 for each wafer position, or the run-up distance that is calculated in advance based on the known settling time may be stored in memory 102.

In the second preferred embodiment, the main control system 22 reads out from the memory 102 information on the settling time for given exposure conditions for each shot area, in advance of scan-exposing the shot area, and calculates the run-up distance and the exposure start position. If the host computer 104 supplies the exposure conditions to the main control system 22, for example, the corresponding exposure command generated from the host computer 104 to the main control system 22 may include information on the settling time (or settling distance) that is actually measured in advance for each shot area under the same scanning exposure conditions, using the scanning exposure apparatus 100 itself.

In this case, when the exposure command is generated from the host computer 104 before scan-exposing each shot area, the calculation control unit 32 in the main control system 22 extracts information (including information on the settling time, etc.) necessary for obtaining the run-up start position of the relevant shot area from the exposure command, and supplies the information to the target position setting unit 35. The target position setting unit 35 then calculates the run-up distance based on the information on the settling time (or settling distance) in the manner as described above to derive the run-up start position. Then, the wafer stage (wafer W) is moved to the run-up start position for the shot area to prepare for scanning exposure. Thus, the run-up start position can be easily and accurately determined based on the settling time suitable for given exposure condition, and the like, for each shot area. Accordingly, the synchronization errors between the wafer and reticle can be confined within a given tolerance before actually starting scanning exposure, and alignment errors can also be suppressed within a given tolerance, thereby achieving highly accurate scanning exposure. The run-up start position, which is based on settling time information measured in advance, can always be set to the optimum position with little waste in the run-up distance, resulting in the improved throughput of the apparatus.

Although the reticle stage above includes the reticle scanning stage 10 and reticle micro driving stage 11, the present invention is not limited to this arrangement, but may be suitably applied to a scanning exposure apparatus having a reticle stage that is not provided with a micro driving stage.

As described above, the present invention provides an excellent scanning exposure method and apparatus that is able to establish an optimum run-up distance for each shot area, thus assuring the improved throughput while maintaining high exposure accuracy.

It will be apparent to those skilled in the art that various modifications and variations can be made in the scanning exposure method and apparatus of the present invention without departing from the spirit or scope of the invention. Thus, it is intended that the present invention cover the modifications and variations of this invention provided they come within the scope of the appended claims and their equivalents.

What is claimed is:

1. An exposure method for exposing a plurality of shot areas formed on a substrate by scanning the shot areas with respect to an exposure light, the method comprising the steps of:

obtaining run-up distance information corresponding to each of the plurality of shot areas respectively based on a position of the respective shot areas in the substrate, or based on a scanning direction of the substrate when the respective shot areas will be exposed, wherein the run-up distance information is memorized with respect to each of the plurality of shot areas in advance; and exposing the respective shot areas with run-up distances in accordance with the run-up distance information for each of the plurality of shot areas.

2. The method according to claim 1, wherein the position of the respective shot areas in the substrate includes a position of a substrate stage in a predetermined plane, wherein the substrate stage holds the substrate and is movable in the predetermined plane.

3. The method according to claim 1, wherein the run-up distance information includes a run-up start position of a substrate stage in a predetermined plane, wherein the substrate stage holds the substrate and is movable in the predetermined plane.

4. The method according to claim 3, further comprising:

accelerating the substrate stage immediately after reaching run-up start positions for each of the plurality of shot areas.

5. The method according to claim 1, wherein the run-up distance information includes a coefficient to decide the run-up distance of each of the plurality of shot areas.

6. A method for manufacturing a semiconductor device comprising the steps of:

transferring a device pattern onto a substrate using the exposure method according to claim 1.

7. An exposure method for transferring a pattern on a mask onto a plurality of shot areas formed on a substrate by synchronically scanning the substrate and the mask, the method comprising the steps of:

obtaining run-up distance information for a next shot area that will be exposed next based on synchronization error information obtained from at least one shot area that is exposed before the next shot area; and exposing the next shot area with a run-up distance in accordance with the run-up distance information.

8. The method according to claim 7, wherein the synchronization error information includes a time from starting the run-up until when the synchronization error of the substrate and the mask settles within a predetermined tolerance.

9. The method according to claim 7, wherein the run-up distance information includes a run-up start position of a substrate stage in a predetermined plane, wherein the substrate stage holds the substrate and is movable in the predetermined plane.

10. The method according to claim 9, further comprising:

accelerating the substrate stage immediately after reaching a run-up start position of the next shot area.

11. The method according to claim 7, wherein a scanning direction of at least one shot area exposed previously has a same scanning direction of a next shot area when the next shot area will be exposed.

12. The method according to claim 7, wherein at least one shot area exposed previously includes a first shot area formed on another substrate different from the substrate having the next shot area.

13. The method according to claim 12, wherein a position of the first shot area in the other substrate has a same position of the next shot area in the substrate.

14. A method for manufacturing a semiconductor device comprising the steps of:

transferring a device pattern onto a substrate using the exposure method according to claim 7.

* * * * *